United States Patent
Jang

(10) Patent No.: US 7,745,349 B2
(45) Date of Patent: Jun. 29, 2010

(54) METHOD FOR FABRICATING SEMICONDUCTOR TRANSISTOR

(75) Inventor: Jeong-Yel Jang, Eumseong-gun (KR)

(73) Assignee: Dongbu HiTek Co., Ltd., Seoul (KR)

( * ) Notice: Subject to any disclaimer, the term of this patent is extended or adjusted under 35 U.S.C. 154(b) by 3 days.

(21) Appl. No.: 12/137,650

(22) Filed: Jun. 12, 2008

(65) Prior Publication Data

US 2008/0318403 A1 Dec. 25, 2008

(30) Foreign Application Priority Data

Jun. 12, 2007 (KR) .................... 10-2007-0057434

(51) Int. Cl.
*H01L 21/31* (2006.01)
*H01L 21/469* (2006.01)

(52) U.S. Cl. .................... 438/786; 438/9; 438/954; 257/E21.567; 257/E21.311; 257/E21.314; 257/E21.327; 257/E21.416; 257/E21.547

(58) Field of Classification Search ............... 438/854, 438/786, 780, 657, 647, 474, 9; 257/E21.267, 257/311, 314, 327, 416, 547
See application file for complete search history.

(56) References Cited

U.S. PATENT DOCUMENTS

| 5,637,526 | A | * | 6/1997 | Song | 438/253 |
| 5,960,293 | A | * | 9/1999 | Hong et al. | 438/397 |
| 6,969,655 | B2 | * | 11/2005 | Kim | 438/267 |
| 7,572,702 | B2 | * | 8/2009 | Yoon | 438/267 |
| 2004/0082184 | A1 | | 4/2004 | Suzuki | |
| 2005/0287742 | A1 | * | 12/2005 | Kang | 438/257 |

FOREIGN PATENT DOCUMENTS

CN 1494117 A 5/2004

* cited by examiner

*Primary Examiner*—David Nhu
(74) *Attorney, Agent, or Firm*—Sherr & Vaughn, PLLC

(57) ABSTRACT

A method for fabricating a semiconductor transistor which eliminates device defects generated during an etching process for forming gates. The method may include laminating an ONO layer on and/or over a semiconductor substrate, and then coating a polysilicon layer on and/or over the ONO layer, and then forming a photoresist pattern on and/or over the polysilicon layer, and then sequentially performing a first etching of the polysilicon layer using the photoresist pattern as an etching mask so as to maintain a predetermined thickness of the polysilicon layer and then a second etching to remove the polysilicon layer remaining from the first etching.

18 Claims, 3 Drawing Sheets

METHOD FOR FABRICATING SEMICONDUCTOR TRANSISTOR

Figure 1:
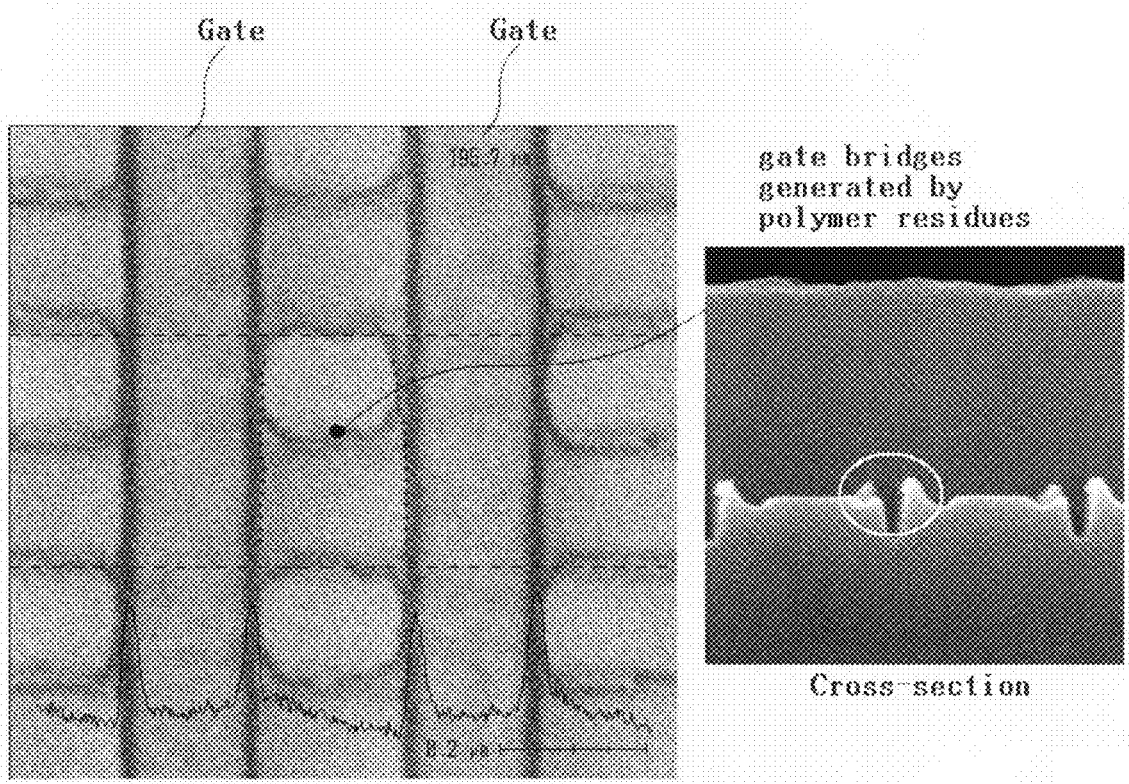

The present application claims priority under 35 U.S.C. §119 to Korean Patent Application No. 10-2007-0057434 (filed on Jun. 12, 2007), which is hereby incorporated by reference in its entirety.

BACKGROUND

In flash devices employing a design rule of 130 nm or less, a transistor may have a structure in which a dielectric layer, e.g., an Oxide-Nitride-Oxide (ONO) layer, for trapping electrons between a floating gate and a control gate is formed. In such a structure, a laminate gate may have a thickness of 3000 Å or more, which is thicker than a general logic transistor having a thickness of 2000 Å. As a result, it is necessary to form a photoresist pattern with a thickness of 5000 Å or more in a photolithography process. However, since it is impossible to form a photoresist pattern as a pitch of a semiconductor device smaller than 250 nm, a gate must be formed by supplementing an insufficient thickness of the photoresist pattern that functions as a mask when performing an etching process using an oxide-based or a nitride-based hard mask. Even when forming a gate by supplementing an insufficient thickness of the photoresist pattern, the components or thickness of the hard mask must be optimized. Moreover, after completing the gate formation, the hard mask film which functioned as a mask must be removed to form a desired silicide on and/or over the control gate. Consequently, the overall process is disadvantageously complicated. As semiconductor devices become highly integrated, the distance between two adjacent laminated gates is shortened. As a result, gap filling is not smoothly carried out in a process of filling an insulation layer, thereby causing frequent formation of voids. Thus, process defects are generated.

In order to solve the above problems, a flash cell device having a silicon-oxide-nitride-oxide-silicon (hereinafter, abbreviated as SONOS) structure is under development. In order to form gates in the flash cell device having such a SONOS structure, a polysilicon layer may be etched, and then a dielectric layer, e.g., an ONO layer, may then be etched using the etched pattern as a mask. However, there is a problem that application of the method is difficult, because polymer residues generate gate bridges, as illustrated in example FIG. 1. That is, since the flash cell device has very high cell integration compared with a general logic device, a problem such that adjacent gate patterns are adhered to each other due to the polymer residues inside the cell is generated.

SUMMARY

Embodiments relate to a method for fabricating a semiconductor transistor which can effectively limit device defects generated during an etching process when forming gates.

Embodiments relate to a method for fabricating a semiconductor transistor that prevents formation of polymer residues in forming a flash cell device having a SONOS structure.

Embodiments relate to a method for fabricating a semiconductor transistor that prevents formation of polymer residues which can be formed in an etching process for forming gates of a flash cell device of 130 nm or less.

Embodiments relate to a method for fabricating a semiconductor transistor that can include at least one of the following steps: forming a first oxide layer, a nitride layer and a second oxide (ONO) layer on and/or over a semiconductor substrate; and then forming a polysilicon layer on and/or over the ONO layer; forming a photoresist pattern for forming gates on and/or over the polysilicon layer; and then performing a first etching process of the polysilicon layer using the photoresist pattern as an etching mask so as to maintain a predetermined thickness and a second etching process to remove the polysilicon layer remaining from the first etching. In accordance with embodiments, the second etching process may be maintained at a higher pressure than the first etching process.

Embodiments relate to a method for fabricating a flash cell device that can include at least one of the following steps: forming a polysilicon layer on a semiconductor substrate; and then sequentially performing a main etching of the polysilicon layer to a predetermined thickness and then an over etching of the polysilicon layer to remove remaining portions of the polysilicon layer.

DRAWINGS

Example FIG. 1 illustrates generation of gate bridges caused by polymer residues in forming gates of a semiconductor transistor having a SONOS structure.

Figure 2:
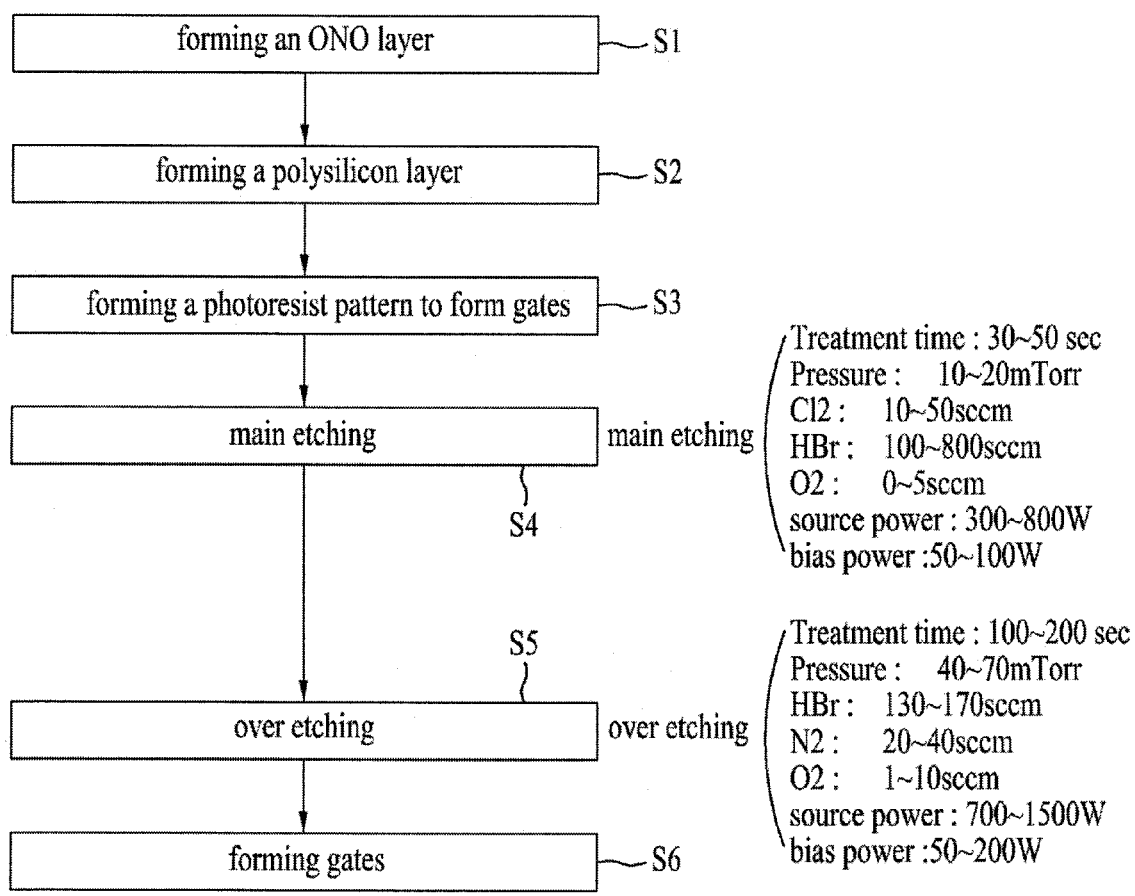

Example FIG. 2 illustrates a method for fabricating a semiconductor transistor having a SONOS structure, in accordance with embodiments.

Figure 3:
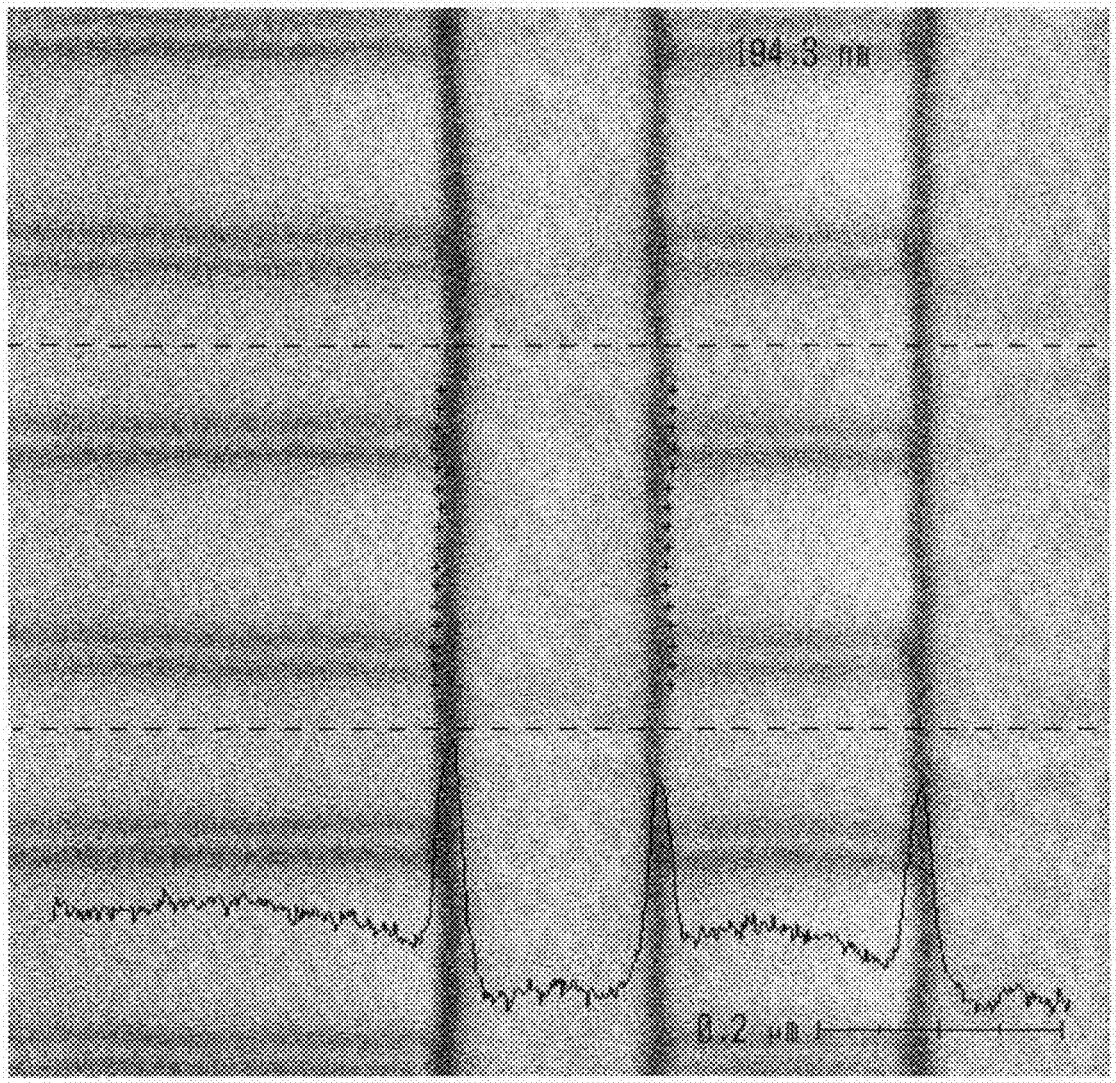

Example FIG. 3 illustrates results after performing an etching process in forming gates of a semiconductor transistor, in accordance with embodiments.

DESCRIPTION

Reference will now be made in detail to embodiments, examples of which are illustrated in the accompanying drawings. Embodiments may, however, encompass various forms and should not be construed as limited to embodiments set forth herein.

A semiconductor transistor in accordance with embodiments may have a SONOS structure including dielectric layers laminated on and/or over an active region to form an ONO layer, and gate electrodes formed on and/or over the ONO layer. The semiconductor transistor may preferably be applicable as a flash cell device having a SONOS structure of 130 nm or less. Such a semiconductor transistor may have be highly integrated, and thus, in order to prevent formation of polymer residues generated during an etching process, an etching process for reducing a residence time of the polymer residues inside a chamber to induce fast discharge of the polymer residues may be conducted.

More particularly, in accordance with embodiments, a decoupled plasma source (DPS) etching unit produced by Applied Material, Inc. (AMAT) may be used. As a result, etching conditions to control the residence time of the polymer residues inside the DPS chamber can be established.

As illustrated in example FIG. 2, an etching process may include a main etching and a secondary or over etching. During the over etching process, the pressure and an etching gas, particularly, a ratio of HBr and $O_2$, may be optimally established. The process and etching conditions allow formation of gates having a complete SONOS structure without polymer residues, as illustrated in example FIG. 3.

In initial step S1, an ONO layer including a first oxide layer, a nitride layer and a second oxide layer may be formed on and/or over a semiconductor substrate. The ONO layer may be a first oxide layer, a nitride layer and a second oxide layer laminated on and/or over an active region of the semiconductor substrate. The first oxide layer may serve as a tunnel oxide layer, the nitride layer may serve as a charging trap layer and the second oxide layer may serve as a charge barrier layer. In step S2, a gate may then be formed on and/or over the ONO layer. In order to form the gate, a conductive polysilicon layer may be coated on and/or over the ONO layer. In step S3, a photoresist pattern to form gates on and/or over the polysilicon layer may then be formed. The photoresist pattern may be formed using a KrF light source. The KrF light source may be used to adjust the width of the photoresist pattern. In accordance with embodiments, a KrF laser having a wavelength of 248 nm in a deep ultraviolet (DUV) region or other excimer lasers may be used. In step S4, the main etching is carried out to etch the polysilicon layer using the photoresist pattern as an etching mask. During the main etching, an etching target of the polysilicon layer may be established such that the ONO layer underneath the polysilicon layer is not exposed. During the main etching, the polysilicon layer may be etched to maintain a predetermined thickness using the photoresist pattern as an etching mask and using a KrF light source. The main etching conditions may be maintained at a treatment time of 30 to 50 seconds, a pressure of 10 to 20 mTorr, a source power of 300 to 800 watt and a bias power of 50 to 100 watt and use a gas mixture that includes a concentration of $Cl_2$ of 10 to 50 sccm, a concentration of HBr of 100 to 800 sccm, a concentration of $O_2$ of 0 to 5 sccm.

In step S5, a secondary or over etching may then be carried out following the main etching. For example, the polysilicon remaining in the areas such as a divot in a trench isolation layer may be removed by the over etching. The over etching conditions may be maintained at a treatment time of 100 to 200 seconds, a pressure of 40 to 70 mTorr, a source power of 700 to 1500 watt, and a bias power of 50 to 200 watt and use a gas mixture that may include a concentration of HBr of 130 to 170 sccm, a concentration of $N_2$ of 20 to 40 sccm and a concentration of $O_2$ of 1 to 10 sccm. During the over etching, the remaining polysilicon layer is removed. Because the over etching is carried out at a pressure of 40 to 70 mTorr and the main etching is carried out at a pressure of 10 to 20 mTorr, the pressure is maintained higher during the over etching. Moreover, the decoupled plasma source (DPS) etching unit may be used for both the main etching and the over etching.

Additionally, in accordance with embodiments, the polysilicon layer may be coated to a sufficient thickness to ensure that the polysilicon layer is not etched down to the semiconductor substrate during the main etching. By etching the polysilicon layer using the main and over etching conditions to form gates, gate bridges caused by formation of polymer residues is not generated, as illustrated in example FIG. 3. Especially, since gate bridges caused by polymer residues are eliminated, device defects which are frequently generated during the etching process for forming gates in the flash device having a SONOS structure of 130 nm or less, are significantly decreased.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A method for fabricating a semiconductor transistor comprising:
    sequentially forming a first oxide layer, a nitride layer, and a second oxide layer as an oxide-nitride-oxide (ONO) layer on a semiconductor substrate;
    forming a polysilicon layer on the ONO layer;
    forming a photoresist pattern on the polysilicon layer;
    performing a first etching of the polysilicon layer to a predetermined thickness at a first pressure using the photoresist pattern as an etching mask; and then
    performing a second etching at a second pressure to remove the polysilicon layer remaining after the first etchings,
    wherein the second pressure is greater than the first pressure, and the second pressure is maintained during the second etching.

2. The method for fabricating a semiconductor transistor of claim 1, wherein the semiconductor transistor comprises a flash cell device.

3. The method for fabricating a semiconductor transistor of claim 2, wherein the flash cell device has a SONGS structure of 130 nm or less.

4. The method for fabricating a semiconductor transistor of claim 1, wherein the first etching and the second etching both comprise a decoupled plasma source etching.

5. The method for fabricating a semiconductor transistor of claim 1, wherein the photoresist pattern is formed using a KrF light source.

6. The method for fabricating a semiconductor transistor of claim 1, wherein performing the first etching comprises performing an etching using a gas mixture of $Cl_2$, HBr, and $O_2$.

7. The method for fabricating a semiconductor transistor of claim 6, wherein the gas mixture has a concentration of $Cl_2$ of 10 to 50 sccm, a concentration of HBr of 100 to 800 sccm, a concentration of $O_2$ of 0 to 5 sccm.

8. The method for fabricating a semiconductor transistor of claim 1, wherein performing the second etching comprises performing an etching using a gas mixture HBr, $N_2$, and $O_2$.

9. The method for fabricating a semiconductor transistor of claim 8, wherein the gas mixture has a concentration of HBr of 130 to 170 sccm, a concentration of $N_2$ of 20 to 40 sccm and a concentration of $O_2$ of 1 to 10 sccm.

10. The method for fabricating a semiconductor transistor of claim 1, wherein the first etching is maintained at a pressure of 10 to 20 mTorr and the second etching is maintained at a pressure of a pressure of 40 to 70 mTorr.

11. The method for fabricating a semiconductor transistor of claim 1, wherein performing the first etching comprises performing an etching at a treatment time of 30 to 50 seconds, a pressure of 10 to 20 mTorr, a source power of 300 to 800 watt and a bias power of 50 to 100 watt.

12. The method for fabricating a semiconductor transistor of claim 1, wherein performing the second etching comprises performing an etching at a treatment time of 100 to 200 seconds, a pressure of 40 to 70 mTorr, a source power of 700 to 1500 watt and a bias power of 50 to 200 watt.

13. A method for fabricating a flash cell device comprising:
    forming a polysilicon layer on a semiconductor substrate; and then
    sequentially performing a main etching of the polysilicon layer to a predetermined thickness at a first pressure and then an over etching of the polysilicon layer at a second pressure to remove remaining portions of the polysilicon layer,
    wherein the second pressure is greater than the first pressure, and the second pressure is maintained during the over etching.

14. The method for fabricating a flash cell device of claim 13, further comprising, before forming the polysilicon layer:
    sequentially forming an oxide-nitride-oxide (ONO) layer on the semiconductor substrate.

15. The method for fabricating a flash cell device of claim 13, wherein the main etching and the over etching both comprise a decoupled plasma source etching.

16. The method for fabricating a flash cell device of claim 13, wherein performing the main etching comprises performing an etching using a first gas mixture of $Cl_2$, HBr, and $O_2$.

17. The method for fabricating a flash cell device of claim 16, wherein performing the over etching comprises performing an etching using a second gas mixture HBr, $N_2$, and $O_2$.

18. The method for fabricating a flash cell device of claim 17, wherein the first gas mixture has a concentration of $Cl_2$ of 10 to 50 sccm, a concentration of HBr of 100 to 800 sccm, a concentration of $O_2$ of 0 to 5 sccm and the second gas mixture has a concentration of HBr of 130 to 170 sccm, a concentration of $N_2$ of 20 to 40 sccm and a concentration of $O_2$ of 1 to 10 sccm.

* * * * *